(12) United States Patent
Fox, IV

(10) Patent No.: US 6,170,132 B1
(45) Date of Patent: Jan. 9, 2001

(54) MAGNETIC LASER BAR CLAMP

(75) Inventor: George J. Fox, IV, Allentown, PA (US)

(73) Assignee: Lucent Technologies Inc., Murray Hill, NJ (US)

(*) Notice: Under 35 U.S.C. 154(b), the term of this patent shall be extended for 0 days.

(21) Appl. No.: 09/388,169

(22) Filed: Sep. 1, 1999

(51) Int. Cl.[7] .............................. A44B 21/00; B32B 31/28
(52) U.S. Cl. .................. 24/303; 24/514; 118/503; 269/8
(58) Field of Search ........................ 24/303, 326, 327, 24/335, 488, 514, 522, 525; 269/8, 246, 247; 118/503

(56) References Cited

U.S. PATENT DOCUMENTS

| | | | |
|---|---|---|---|
| 2,601,424 | * | 6/1952 | Baker .................................. 24/303 X |
| 3,575,304 | * | 4/1971 | Hurst .................................... 269/8 X |
| 3,577,583 | * | 5/1971 | Amann .................................. 24/303 |
| 3,629,905 | * | 12/1971 | Cote .................................... 24/303 X |
| 4,892,295 | * | 1/1990 | Keller ..................................... 269/8 |
| 5,044,050 | * | 9/1991 | Trinkaus ........................... 24/303 X |
| 5,425,160 | * | 6/1995 | Krapf .................................. 24/303 X |
| 5,682,653 | * | 11/1997 | Berglöf et al. ......................... 24/303 |
| 5,818,318 | * | 10/1998 | Ligthart et al. ..................... 269/8 X |
| 5,911,830 | * | 6/1999 | Chakrabarti et al. ................ 118/503 |

\* cited by examiner

*Primary Examiner*—Robert J. Sandy
(74) *Attorney, Agent, or Firm*—Duane Morris & Heckscher LLP

(57) ABSTRACT

A clamp for holding at least one laser component during a facet coating process. The clamp includes a first elongate member for contacting a first side of the laser component(s) and a second elongate member for contacting a second side of the laser component(s). The clamp also includes a magnetic member overlying a third side of the laser component(s), and at least one magnet disposed adjacent to the magnetic member, so that the magnetic member is drawn towards the third side of the laser component(s). The first and second elongate members, the magnetic member and the at least one magnet hold the laser component(s) therebetween.

20 Claims, 5 Drawing Sheets

MAGNETIC LASER BAR CLAMP

FIELD OF THE INVENTION

The present invention relates to a clamp, and in particular, a clamp for holding electrical components.

DESCRIPTION OF THE RELATED ART

During the production of electrical components, it is often necessary to hold the components during different stages of manufacture. For example, during the production of laser bars and laser chips (collectively laser components) it is often necessary to hold the laser components during a facet coating process. The facet coating process entails coating different portions of the laser components to modify the light output of the components.

One device which utilizes facet-coated laser components is the Optical Subassembly (OSA). The OSA includes an electrical circuit coupled to the laser component which causes the component to emit laser beams. The laser beams are directed toward a lens of the OSA which collimates the beams into an output beam or beams with a specified light output level. The facet coating of the different portions of the laser components serves to optimize the light output of the OSA.

Since laser components are extremely small, they are typically held in a clamp or other securing mechanism during the facet coating process. Traditional clamps hold approximately twenty-eight (28) laser components each. The laser components are loaded into the clamp with spacers placed therebetween. Once the clamp is loaded with laser components, it is placed into a facet coating machine where portions of the components are coated with a facet coating substance, such as a light-reflective substance.

FIGS. 1 and 2 show a conventional clamp 10 for use in a facet coating process. The clamp 10 includes a housing 20 into which a plurality of laser components 40, in particular laser bars, are placed. The housing 20 includes a plurality of spacers 30 which are coupled to a spring-loaded mechanism (not shown) for holding the spacers together. The spacers 30 are disposed within a track 21 in the housing 20, and are coupled to an end bar 31, such that when the end bar is moved away from the spacers the spacers separate from one another. The spring-loaded mechanism causes the spacers 30 to come together again when the end bar 31 is released. The separation of spacers 30 from one another allows a user to insert laser components 40 into the housing 20 between the spacers. In particular, when the end bar 31 is retracted and the spacers 30 are separated from one another, a user may insert a laser component 40 so that upper 41 and lower 42 faces of the component are disposed against each of two spacers (see FIG. 2). Once components 40 have been placed in all the spaces between spacers 30, the end bar 31 is released and the spring-loaded mechanism retracts to tightly hold the components between the spacers.

FIG. 2 is a magnified view of the track 21 of the housing showing components 40 and spacers 30 placed therein. Note that a spacer 30 is disposed on either side of each component 40 to securely hold the component therebetween. The spacers 30 contact the upper 41 and lower 42 faces of the component 40. The components includes test patterns 45 formed on the ends of the component. These test patterns 45 are areas of the laser component 40 which are not used, and thus they are eventually cut away in later stages of the manufacturing process.

In order to perform the facet-coating process, the clamp 10 is loaded with components 40 at the points between the spacers 30 as described above. The clamp 110 is then placed in a facet coating device where the exposed side faces of the components are coated with a facet-coating substance. Once the facet coating is completed, the clamp 10 is removed from the facet coating device, and the components are removed therefrom. In order to remove the components 40, the end bar 31 is moved away from the spacers, thereby causing the spacers to separate from one another. Then, the facet-coated components 40 are removed from the clamp 10 by hand.

Since the spacers 30 essentially form a part of the housing 20, they are reused each time each time a facet coating process is performed. Thus, the spacers often become worn or over-coated with a facet coating substance causing problems in subsequent processes. Additionally, the pressure of the spacers 30 against the upper and lower faces of the components 40 caused by the spring-loaded mechanism often causes cracking and chipping of the components.

Thus, there is currently a need for an improved clamp for laser components.

SUMMARY OF THE INVENTION

The present invention is a clamp for holding at least one electronic component. The clamp includes a first elongate member for contacting a first side of the electronic component(s) and a second elongate member for contacting a second side of the electronic component(s). The clamp also includes a magnetic member overlying a third side of the electronic component(s), and at least one magnet disposed adjacent to the magnetic member, so that the magnetic member is drawn towards the third side of the electronic component(s).

The first and second elongate members, the magnetic member and the at least one magnet are capable of holding the electronic component(s) therebetween.

The above and other features of the present invention will be better understood from the following detailed description of the preferred embodiments of the invention which is provided in connection with the accompanying drawings.

DETAILED DESCRIPTION

Figure 1:
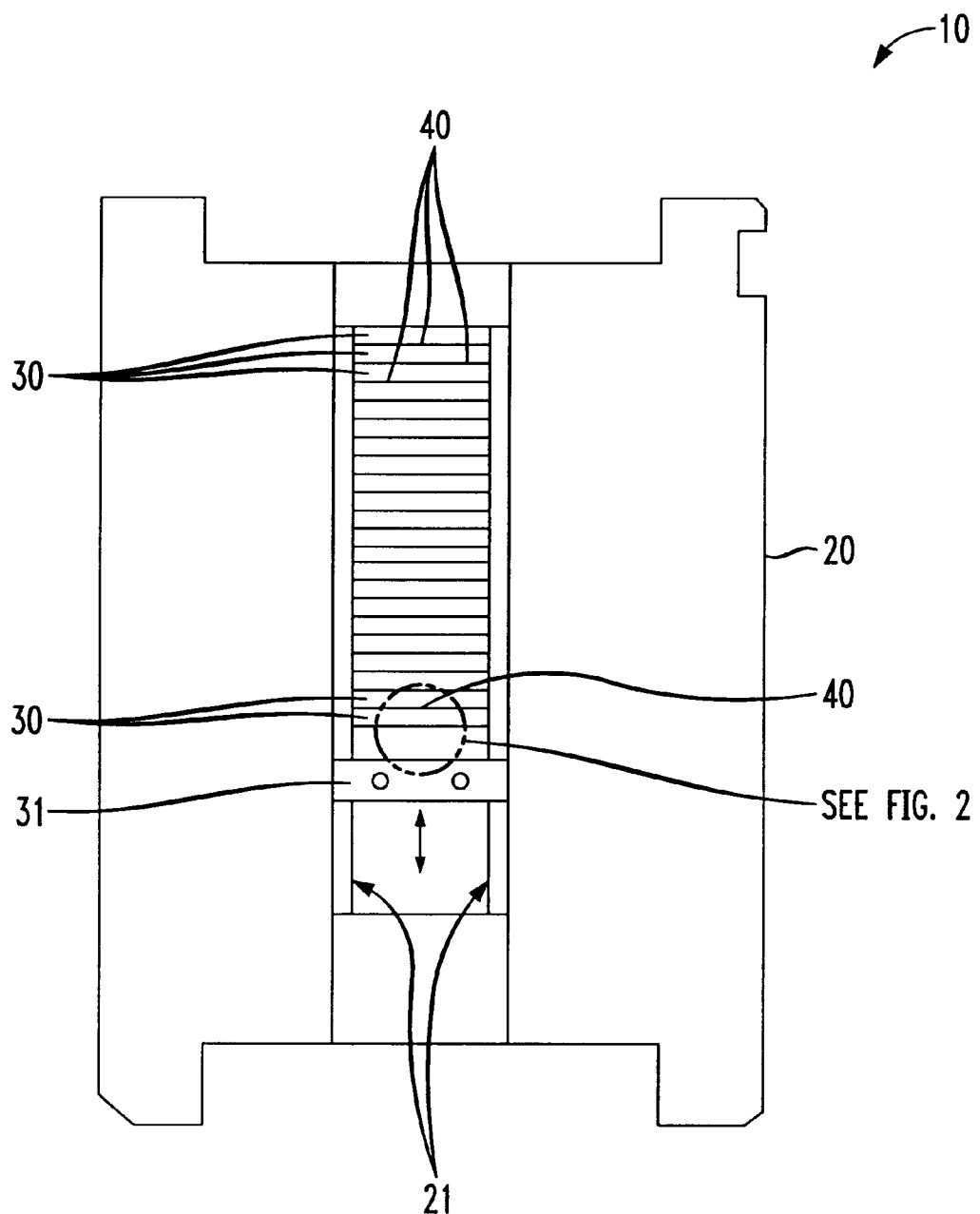
FIG. 1 is a top elevation view conventional clamp.
Figure 2:
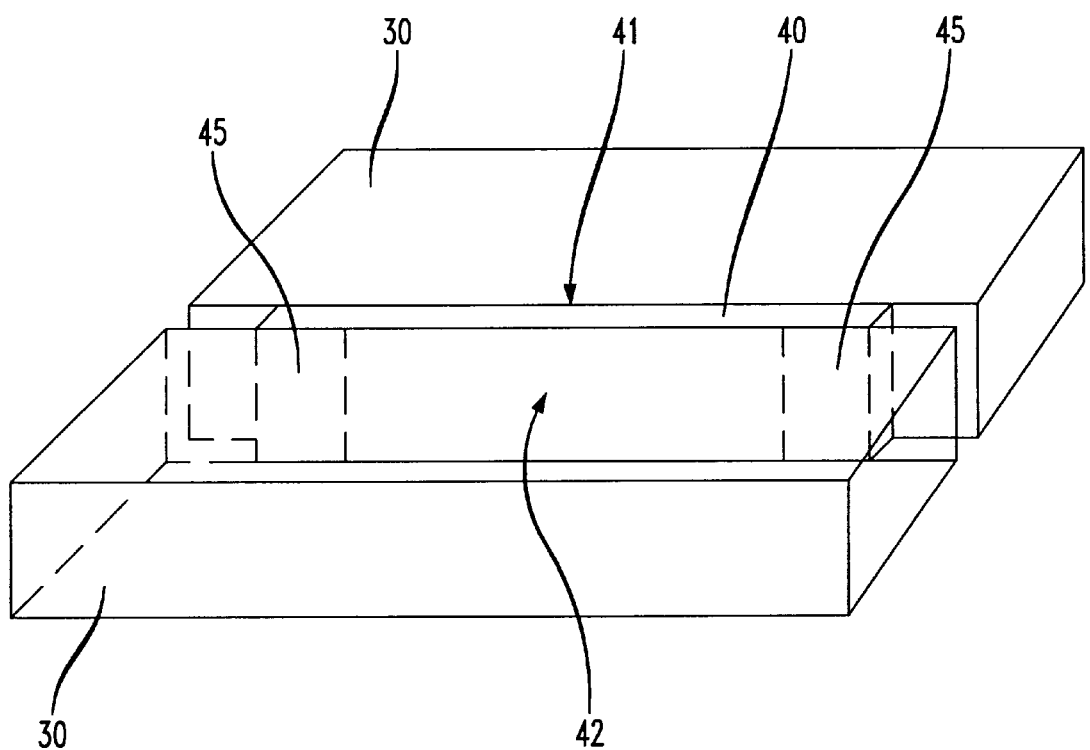
FIG. 2 is a magnified view of a portion of the clamp of FIG. 1.
Figure 3A:
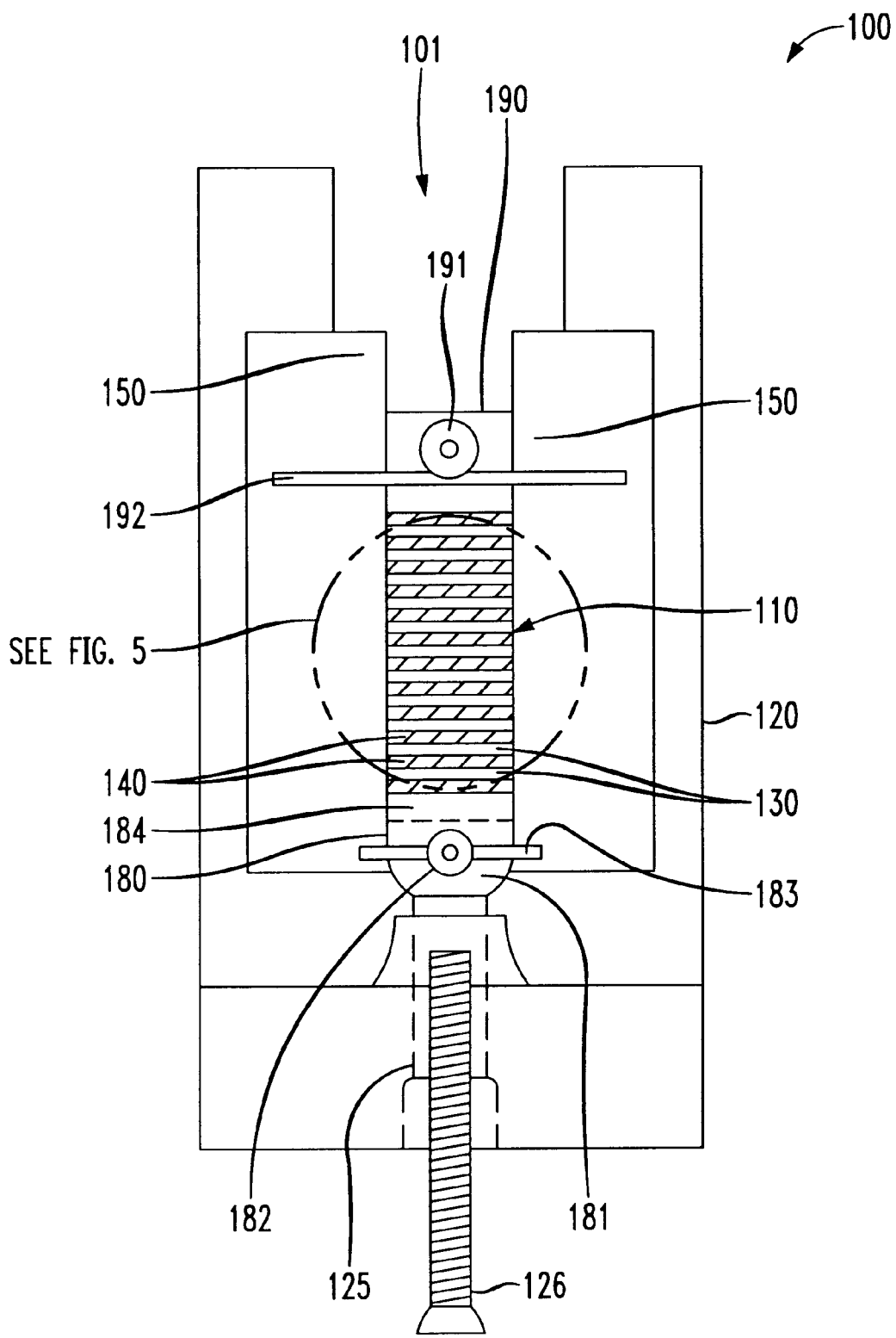
FIG. 3(a) is a top elevation view of a clamp according to an exemplary embodiment of the present invention.
Figure 3B:
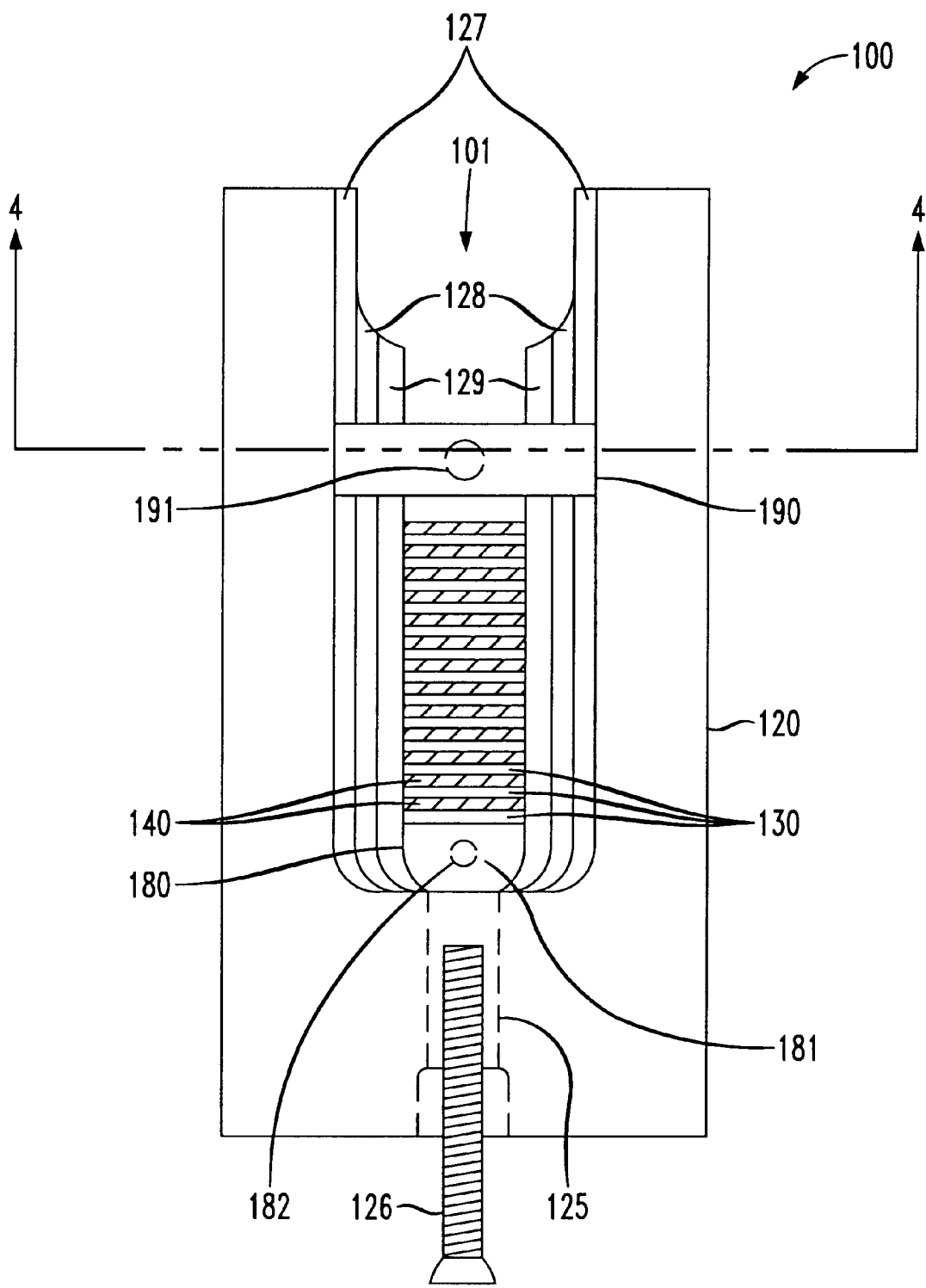
FIG. 3(b) is a bottom elevation view of a clamp according to an exemplary embodiment of the present invention.
Figure 4:
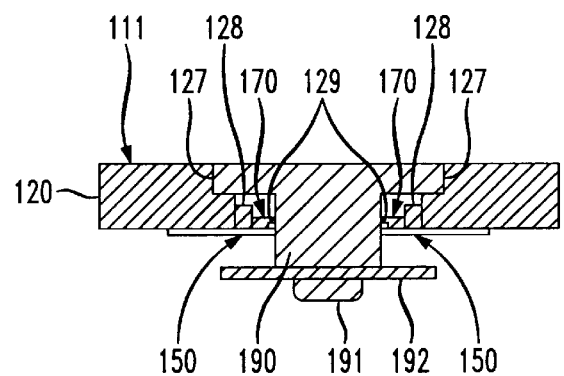
FIG. 4 is a cross-sectional view of the clamp shown in FIG. 3(b) taken along line 4—4.

Referring to FIGS. 3(a), 3(b) and 4, there is shown a clamp 100 according to an exemplary embodiment of the present invention. FIGS. 3(a) and 3(b) show top and bottom elevation view, respectively of the clamp 100, and FIG. 4 shows a cross-sectional view taken along line 4—4 in FIG. 3(a). The clamp 100 is used to hold a plurality of laser components 140, for example laser bars, and a plurality of spacers 130 during a facet-coating process.

FIG. 3(a) shows the clamp 100 which is formed by a substantially U-shaped housing 120. The housing 120 includes an open end 101 through which laser components 140 and spacers 130 are inserted. The housing 120 may be formed of a unitary metal or plastic piece, however metal is preferred. The housing 120 includes a central portion 110 which serves to hold a plurality of spacers 130 and laser components 140. The spacers 130 and laser components 140 are situated in the central portion 110 between first 180 and second 190 stoppers. The stoppers 180, 190 may also be formed of metal or plastic, but metal is preferred. The first stopper 180 includes a rear portion 181 which is coupled by a screw 182 to a first retaining foil 183. The retaining foil 183 is formed of a flat, thin metal piece in the exemplary embodiment of the present invention, but may be formed from other materials without departing from the scope of the invention. A front portion 184 of the first stopper 180 is flattened to accept a few of the spacers 130 and laser components disposed in the central portion 110 of the housing 120 (see FIG. 3(b)). The dashed line in FIG. 3(a) indicates the separation between the front 184 and rear 181 portions of the first stopper 180. The retaining foil 183 of the first stopper 180 rests against a set of second retaining foils 150 disposed on the sides of the central portion 110 of the housing 120. The first retaining foil 183 prevents random movements of the stopper 180 in the central portion 110 of the housing 120 due to orientation and handling, and allows the stopper to move transversely in the central portion. Again, the retaining foils 150 are formed of flat, thin metal pieces in the exemplary embodiment of the present invention, but may be formed from other materials without departing from the scope of the invention.

The second stopper 190 is disposed at an opposite end of the central portion 110 from the first stopper 180, at the other end of the plurality of spacers 130 and laser components 140. The second stopper 190 includes a screw 191 which couples the stopper to a third retaining foil 192. As with the first stopper 180, the retaining foil 192 prevents the stopper 190 from falling through the central portion 110 of the housing and allows the stopper to move transversely in the central portion. The retaining foil 192 rests against the set of second retaining foils 150 disposed on either side of the central portion 110.

Figure 5:
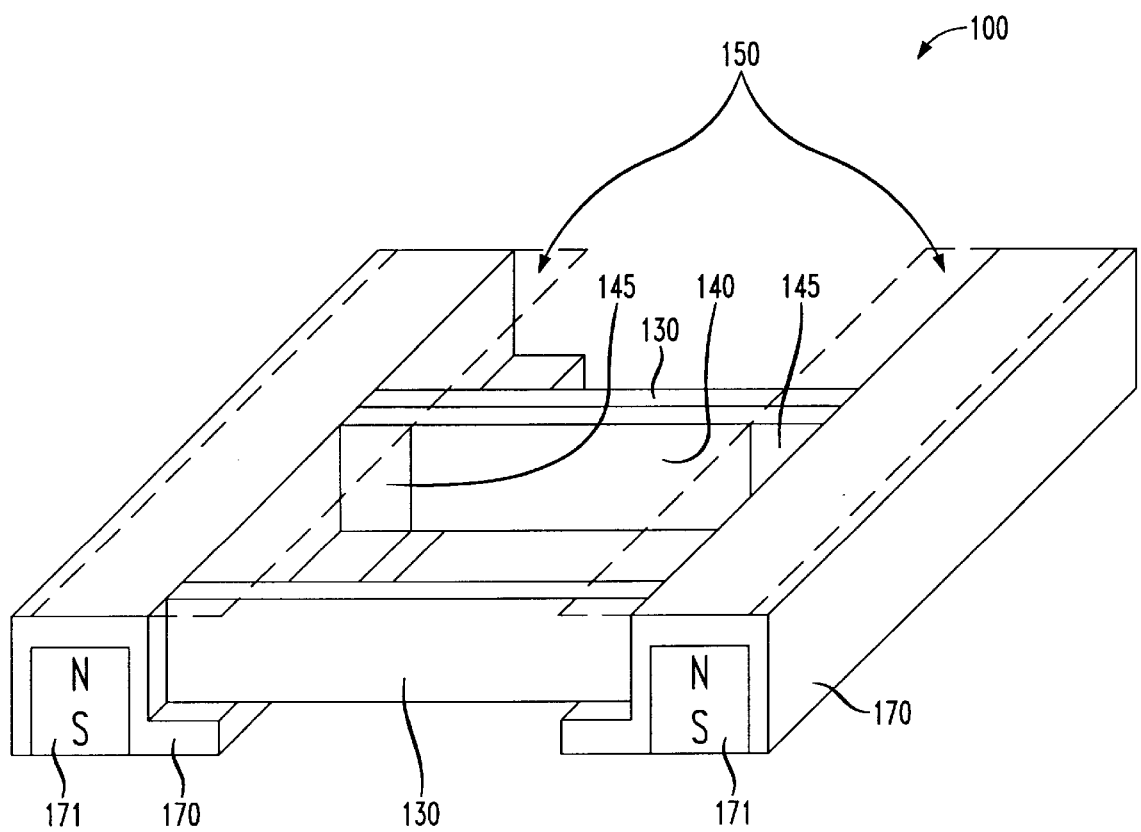
FIG. 5 shows a magnified view of a portion of the clamp of FIG. 3(a).

The second retaining foils 150, mentioned above, are held to the housing 120 by magnetic forces created by permanent magnets 171 disposed within L-shaped portions 170 of the housing 120 (See FIG. 5). In particular, the metal of the foils 150 is attracted by the magnets 171, and thus the foils are held against the L-shaped portions 170 of the housing 120. The housing 120 also includes a bore 125 for receiving a screw 126. When inserted in the bore 125 of the housing 120, the screw 126 acts to press against the rear portion 181 of the first stopper 180. Thus, when the screw 126 is rotated in a clockwise direction, the first stopper 180 is moved transversely in the central portion 110 of the housing 120 towards the second stopper 190. The screw 126 is used for removing the components 140 and spacers 130 from the central portion 110 of the clamp as explained below.

FIG. 3(b) shows a bottom view of the clamp 100. As explained above with reference to FIG. 3(a), only a rear portion 181 of the first stopper 180 is shown in FIG. 3(b) because the first few laser components 140 and spacers 130 rest on the front portion 184 of the first stopper. The housing 120 also includes first 127, second 128 and third 129 tracks disposed therein. The first track 127 allows the second stopper 190 to move transversely therein.

FIG. 4 shows a cross-sectional view of the clamp 100 taken along line 4—4 in FIG. 3(a). As can be seen, the tracks 127, 128, and 129 are disposed at different heights with respect to a bottom surface 111 of the housing 120. The second stopper 190 is shown disposed in the first track 127, and as stated above, the second stopper is movable transversely in the first track. As stated above, the third retaining foil 192 keeps the second stopper 190 disposed in the central portion 110 of the housing 120. The third track 129 includes L-shaped portions 170 along the ends thereof closest to the central portion 110 of the housing 120. The L-shaped portions 170, along with the second retaining foils 150 operate to hold the laser components 140 and spacers 130 in the housing as explained below. FIG. 5 is a magnified view of the components 140 and spacers 130 as disposed within the central portion 110 of the housing 120. Each laser component 140 is disposed between two spacers 130 as shown. The spacers 130 protect the upper and lower faces of the laser components 140 from damage during the facet-coating process. It should be noted that each laser component 140 includes a test pattern area 145 at opposite ends thereof, which is later removed when the laser component is diced. The test pattern areas 145 of the laser components 140 contacts the L-shaped portions 170 are held thereby. As explained above, the retaining foils 150 are held to the housing by magnetic forces created by permanent magnets 171 disposed inside the housing. The retaining foils 150 prevent the laser components 140 and spacers 130 from falling out of the clamp 100 once they are placed therein.

Laser components 140 and spacers 130 are loaded into the clamp 100 as described below. First, the second stopper 190 is removed from the clamp 100 by sliding it transversely out of the open end 101 of the housing 120 along first track 127. Then, a first spacer 130 is loaded into the clamp 100 from the open end 101 of the housing 120. The spacer 130 is placed into the L-shaped portions 170 of the third track 129 at the open end 101 of the housing 120, and is moved down the track until it becomes disposed against the front portion 181 of the first stopper 180. Next, a first laser component 140 is placed into the clamp 100 in the same manner in which the first spacer 130 was placed. This process is continued, alternating components 140 and spacers 130, until the clamp 100 is fully loaded with spacers and components. Since the laser components 140 and spacers 130 are very small, the movement and placement of the components within the L-shaped portions 170 of the track 129 may be accomplished by a vacuum tool or other similar means.

Once the clamp 100 is fully loaded with components, the second stopper 190 is placed back into the central portion 110 of the housing by sliding it into the open end 101 of the housing 120 on track 129. The second stopper 190 is moved towards the last component 140 or spacer 130 in the clamp (preferably a spacer) until it abuts the last component or spacer. The second stopper 190 should be pressed against the last spacer 130 or component 140 until any spaces between the plurality of components and spacers have been substantially eliminated. Once the spaces have been substantially eliminated, the clamp 100 is ready for facet-coating. The entire clamp 100 is then placed into a facet-coating device (not shown) where the laser components 140 are coated on their exposed faces with, for example, a light reflective material.

After the facet-coating, the clamp 100 is removed from the facet-coating device, and the laser components 140 and spacers 130 are removed from the clamp. The components 140 and spacers 130 are removed by first removing the second stopper 190. Then, the screw 126 is rotated clockwise, by a screwdriver or other similar means, to move the first stopper 180 towards the plurality of spacers 130 and laser components 140. The movement of the stopper 180 presses the spacers 130 and components 140 out of the open end 101 of the clamp 100. After all the laser components 140 and spacers have been removed, the clamp is reloaded with more components and spacers, and the above process is repeated.

It should be noted that since the spacers 130 do not form an integral part of the housing 120, as opposed to the conventional clamp 10, they may be removed and discarded after each facet-coating. Thus, the problems associated with conventional clamps, such as coating buildup on the spacers, are substantially eliminated. Additionally, since the screw 126 and first and second stoppers 180, 190 exert minimal pressure on the laser components 140 and spacers 130, the cracking and breaking of components due to pressure is substantially decreased.

Although the invention has been described in terms of an exemplary embodiment, it is not limited thereto. Rather, the appended claims should be construed broadly, to include other variants and embodiments of the invention which may be made by those skilled in the art without departing from the scope and range of equivalents of the invention.

What is claimed is:

1. A clamp comprising:
    a first elongate member for contacting a first side of at least one component;
    a second elongate member for contacting a second side of the at least one component, said second side opposing said first side;
    a magnetic member for overlying a third side of the at least one component, said third side orthogonal to said first and second sides;
    a first stopper member for contacting a fourth side of the at least one component, said fourth side orthogonal to said first, second and third sides; and,
    at least one magnet disposed adjacent said magnetic member, so that the magnetic member is drawn towards the third side of the at least one component,
    wherein the first and second elongate members, the magnetic member and the at least one magnet are capable of holding the at least one component therebetween.

2. The clamp of claim 1, wherein the at least one component comprises at least one electronic component.

3. The clamp of claim 2, wherein the at least one electronic component comprises at least one laser component.

4. The clamp of claim 2, wherein the at least one electronic component comprises at least one laser bar.

5. A clamp comprising:
    a first elongate member for contacting a first side of at least one component:
    a second elongate member for contacting a second side of the at least one component. said second side opposing said first side: and.
    a magnetic member for overlying a third side of the at least one component, said third side orthogonal to said first and second sides; and,
    at least one magnet disposed adjacent said magnetic member, so that the magnetic member is drawn towards the third side of the at least one component,
    wherein the first and second elongate members, the magnetic member and the at least one magnet are capable of holding the at least one component therebetween, and wherein the magnetic member comprises a magnetic foil.

6. The clamp of claim 2, wherein the at least one electronic component includes a test pattern formed on the first and second sides thereof.

7. The clamp of claim 6, wherein the test pattern is also formed on the third side of the electronic component, and wherein the magnetic member substantially covers the test pattern formed on the third side.

8. The clamp of claim 2, wherein the at least one electronic component comprises a plurality of components.

9. The clamp of claim 8, further comprising a plurality of spacers disposed between each of the plurality of electronic components.

10. The clamp of claim 1, wherein the first and second elongate members are substantially L-shaped.

11. A clamp for holding laser components during a facet coating process comprising:
    a first elongate member for contacting a first side of at least one laser component;
    a second elongate member for contacting a second opposing side of the at least one laser component;
    a magnetic member for overlying a third side of the at least one laser component, said third side orthogonal to said first and second sides;
    a first stopper member for contacting a fourth side of the at least one component, said fourth side orthogonal to said first, second and third sides; and,
    at least one magnet disposed adjacent said magnetic member, so that the magnetic member is drawn towards the third side of the at least one laser component,
    wherein the first and second elongate members, the magnetic member and the at least one magnet are capable of holding the at least one laser component therebetween.

12. The clamp of claim 11, wherein the at least one laser component includes a test pattern formed on the first and second sides thereof.

13. The clamp of claim 12, wherein the test pattern is also formed on the third side of the laser component, and wherein the magnetic member substantially covers the test pattern formed on the third side.

14. The clamp of claim 11, wherein the at least one laser component comprises a plurality of components.

15. The clamp of claim 14, further comprising a plurality of spacers disposed between each of the plurality of laser components.

16. The clamp of claim 11, wherein the first and second elongate members are substantially L-shaped.

17. The clamp of claim 11, further comprising:
    a second stopper member for contacting a fifth side of the at least one component, said fifth side orthogonal to said first, second and third sides and opposite said fourth side.

18. The clamp of claim 1, further comprising:
    a second stopper member for contacting a fifth side of the at least one component, said fifth side orthogonal to said first, second and third sides and opposite said fourth side.

19. A clamp for holding laser components during a facet coating process comprising:
    a first elongate member for contacting a first side of at least one laser component;
    a second elongate member for contacting a second opposing side of the at least one laser component; and,
    a magnetic member for overlying a third side of the at least one laser component, said third side orthogonal to said first and second sides; and,
    at least one magnet disposed adjacent said magnetic member, so that the magnetic member is drawn towards the third side of the at least one laser component, wherein the first and second elongate members, the magnetic member and the at least one magnet are capable of holding the at least one laser component therebetween, and wherein the magnetic member comprises a magnetic foil.

20. A clamp comprising:

a first elongate member for contacting a first side of a plurality of electronic components;

a second elongate member for contacting a second side of the plurality of electronic components, said second side opposing said first side;

a plurality of spacers capable of being disposed between the plurality of electronic components;

a magnetic member for overlying a third side of the plurality of electronic components, said third side orthogonal to said first and second sides; and, at least one magnet disposed adjacent said magnetic member, so that the magnetic member is drawn towards the third side of the plurality of electronic components, wherein the first and second elongate members, the magnetic member and the at least one magnet are capable of holding the plurality of electronic components therebetween.

* * * * *